(12) United States Patent
Teraguchi et al.

(10) Patent No.: US 6,177,685 B1
(45) Date of Patent: *Jan. 23, 2001

(54) NITRIDE-TYPE III-V HEMT HAVING AN INN 2DEG CHANNEL LAYER

(75) Inventors: Nobuaki Teraguchi, Kusatsu; Akira Suzuki, Nara, both of (JP)

(73) Assignee: Sharp Kabushiki Kaisha (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/235,053

(22) Filed: Jan. 20, 1999

(30) Foreign Application Priority Data

Jan. 20, 1998 (JP) .................................. 10-008210

(51) Int. Cl.[7] ........................... H01L 29/06; H01L 29/12; H01L 29/15
(52) U.S. Cl. ............................. 257/20; 257/24; 257/76; 257/192; 257/194; 257/201; 257/610; 257/612; 257/615
(58) Field of Search .................................. 257/194, 192, 257/20, 24, 76, 201, 615, 610, 612

(56) References Cited

U.S. PATENT DOCUMENTS

| 5,192,987 |   | 3/1993  | Khan et al. |
|-----------|---|---------|-------------|
| 5,611,955 | * | 3/1997  | Barrett et al. ........................ 252/62.3 |
| 5,831,277 | * | 11/1998 | Razeghi ................................. 257/15 |
| 5,847,414 | * | 12/1998 | Harris et al. .......................... 257/77 |
| 5,856,217 | * | 1/1999  | Nguyen et al. ....................... 438/172 |
| 5,929,467 | * | 7/1999  | Kawai et al. ......................... 257/192 |

OTHER PUBLICATIONS

Kruppa et al. "Low–frequency dispersion characteristics of GaN HFETs" *Elect. Lett.* (1995) 31(22):19511952.

* cited by examiner

Primary Examiner—Jerome Jackson, Jr.
Assistant Examiner—Bradley W. Baumeister
(74) Attorney, Agent, or Firm—Morrison & Foerster LLP (57) ABSTRACT

A nitride-type III–V group compound semiconductor device includes a substrate and a layered structure including at least a channel layer using two-dimensional electron gas formed over a substrate, wherein the channel layer contains InN.

10 Claims, 8 Drawing Sheets

NITRIDE-TYPE III-V HEMT HAVING AN INN 2DEG CHANNEL LAYER

BACKGROUND OF THE INVENTION

1. Field of the Invention

The present invention relates to a nitride-type III–V group compound semiconductor device, and in particular, to a semiconductor device using two-dimensional electron gas which has outstanding operational characteristics at high output, high frequency, and high temperature.

2. Description of the Related Art

Semiconductor devices using two-dimensional electron gas include a hetero-structure field-effect transistor (HFET), a high-electron-mobility transistor (HEMT), and a modulation-doped field effect transistor (MODFET). As such semiconductor devices using two-dimensional electron gas, a device using GaAs-type materials is under development.

Figure 8:
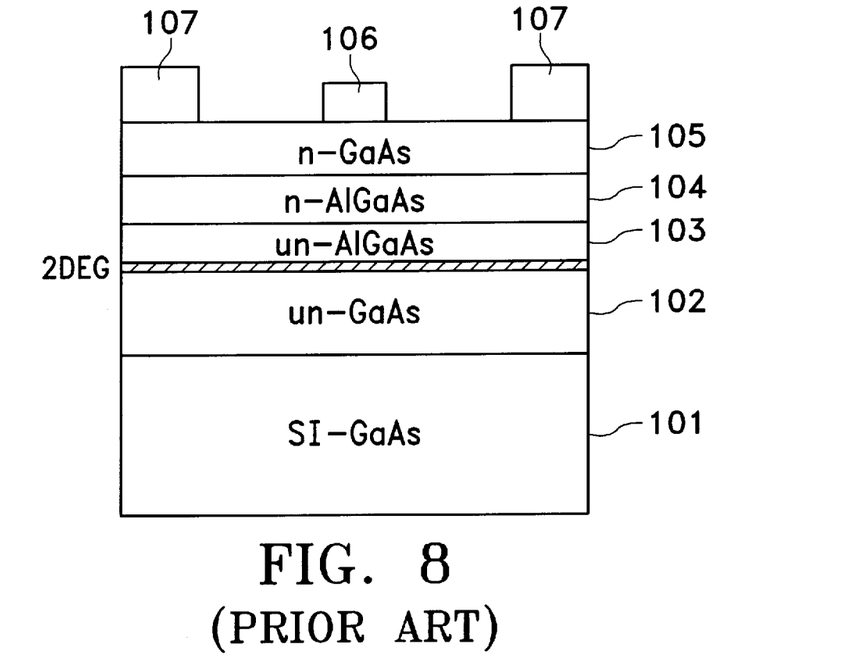
FIG. 8 is a cross-sectional view showing a structure of a conventional GaAs-type HFET.

As shown in FIG. 8, a conventional GaAs-type HFET generally includes, on a semi-insulating (SI-) GaAs substrate 101, an undoped GaAs buffer layer 102 (thickness: 1 $\mu$m and carrier concentration: $3\times10^{16}$ cm$^{-3}$), an undoped AlGaAs spacer layer 103 (thickness: 10 nm and carrier concentration: $1\times10^{17}$ cm$^{-3}$), an n-type AlGaAs donor layer 104 (thickness: 20 nm and carrier concentration: $1\times10^{18}$ cm$^{-3}$), and an n-type GaAs cap layer 105 (thickness: 10 nm and carrier concentration: $3\times10^{18}$cm$^{-3}$). Reference numerals 106 and 107 in FIG. 8 denote a gate electrode and source/drain electrodes, respectively.

It should be noted that in the drawings, the term "2DEG" means "2-Dimensional Electron Gas" which is generated at the interface between a barrier and a channel when a hetero junction is formed.

Figure 9:
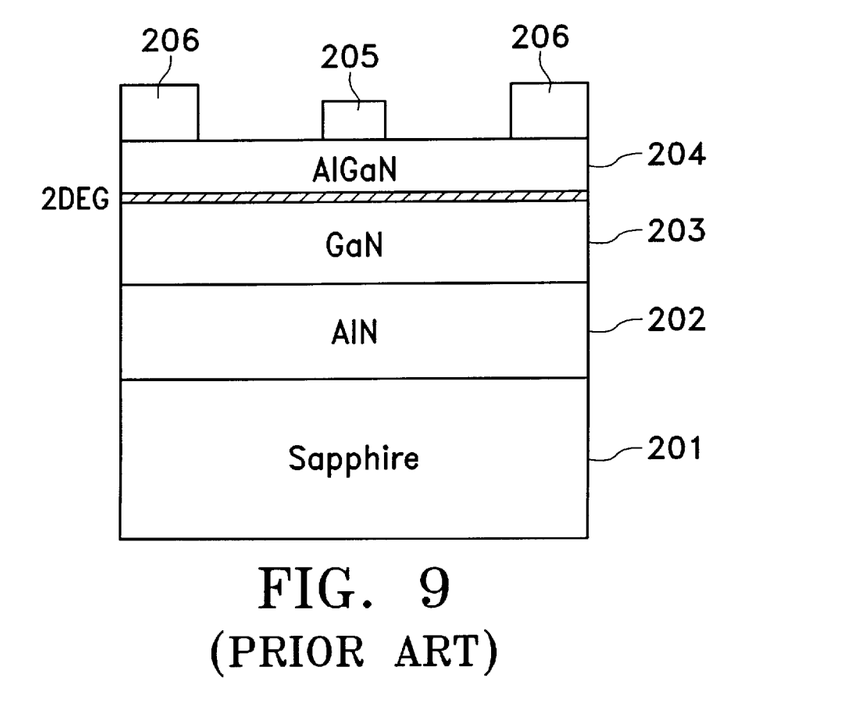
FIG. 9 is a cross-sectional view showing a structure of a conventional GaN-type HFET.

Moreover, FIG. 9 shows a structure of a conventional HFET using a nitride-type III–V group compound semiconductor (U.S. Pat. No. 5,192,987). The illustrated HFET using a nitride-type III–V group compound semiconductor has substantially the same structure as that of the GaAs-type HFET. Specifically, as shown in FIG. 9, the illustrated HFET using a nitride-type III–V group compound semiconductor includes, on an insulating substrate 201 (e.g., a sapphire substrate), an AlN low-temperature grown buffer layer 202 (thickness: 20 nm), a GaN buffer layer 203 (thickness: 2 $\mu$m and carrier concentration of $8\times10^{16}$ cm$^{-3}$), an AlGaN donor layer 204 (thickness of 20 nm and carrier concentration of $1\times10^{18}$ cm$^{-3}$), a gate electrode 205, and source/drain electrodes 206, and uses GaN as a channel material.

Figure 10:
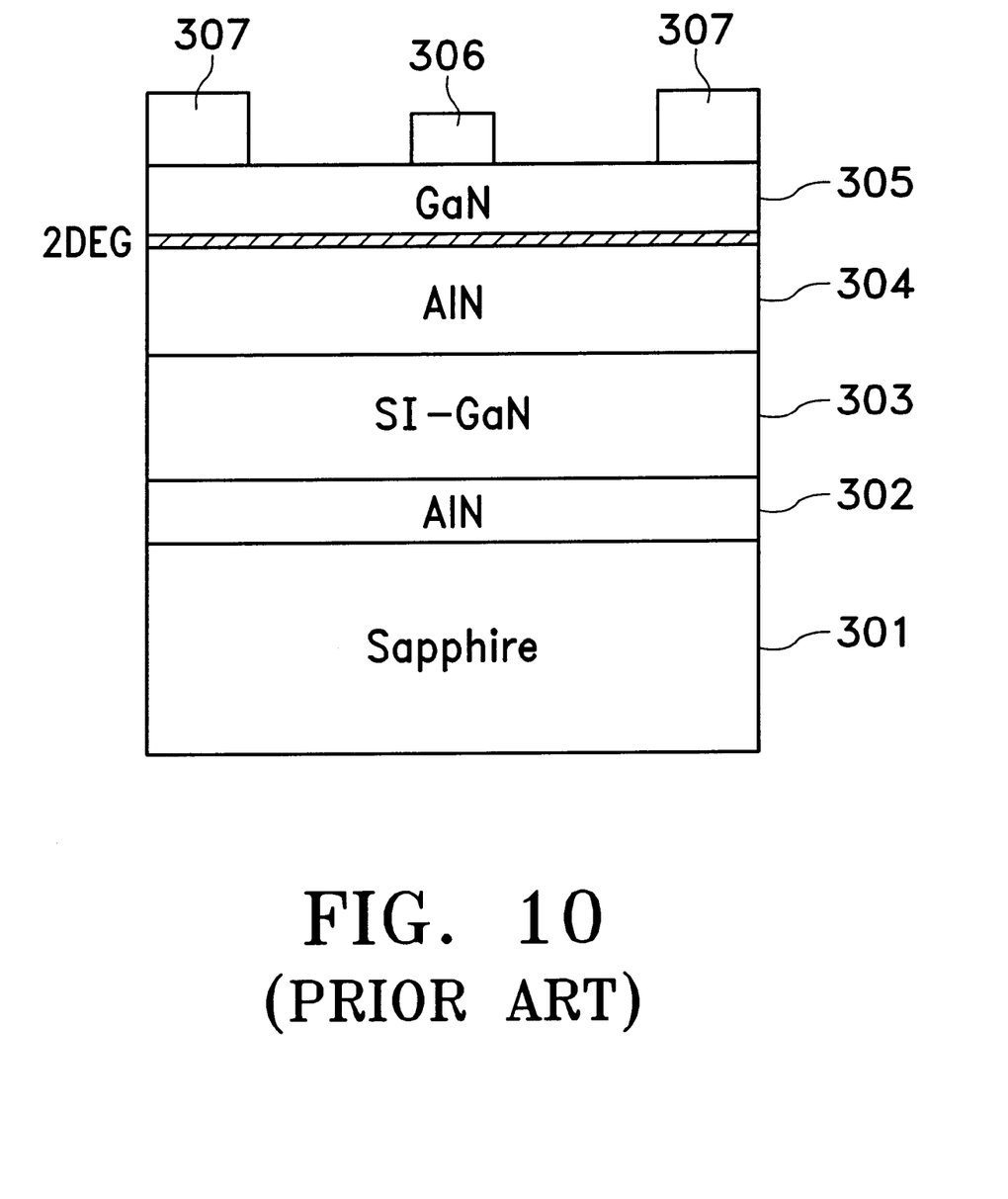
FIG. 10 is a cross-sectional view showing a structure of a conventional GaN-type reverse structure HFET.

FIG. 10 shows a reverse structure HFET (Electronics Lett., Vol. 31, No. 22, (1995) pp. 1951–1952). As shown in FIG. 10, the reverse structure HFET includes, on an insulating substrate 301 made of sapphire and the like, an AlN low-temperature grown buffer layer 302 (thickness: 20 nm), a GaN buffer layer 303 (thickness: 3 $\mu$m), an AlN barrier layer 304 (thickness: 3 nm), and a GaN channel layer 305 (thickness: 100 nm). Reference numerals 306 and 307 in FIG. 10 denote a gate electrode and source/drain electrodes, respectively.

An electron mobility of GaN, which is conventionally used as a constituting material of a channel layer, is about 200 cm$^2$/Vs when its carrier concentration is about $1\times10^{18}$ cm$^{-3}$ and about 400 cm$^2$/Vs when its carrier concentration is about $1\times10^{17}$ cm$^{-3}$. This electron mobility is about one order of magnitude greater than that of other wide-band gap materials such as SiC, but about one order of magnitude smaller than that of GaAs used in a GaAs-type HFET.

In the case of the GaAs-type HFET, as described in Japanese Laid-Open Publication No. 63-161678, an InGaAs mixed crystal which has a larger mobility as compared with GaAs can be inserted to an interface of AlGaAs and GaAs as a channel material. Thus, it was considered that the similar method (i.e., insertion of InGaN) would be available for a nitride-type semiconductor device. In contrast to such expectation, however, in the case of the nitride-type III–V group compound semiconductor device, satisfactory crystallinity and/or flatness can not be obtained in the inserted InGaN mixed crystal, so that an electron mobility does not always become larger. Thus, the effect obtainable by an InGaAs channel layer in the GaAs-type HFET cannot be expected by the insertion of InGaN crystal.

SUMMARY OF THE INVENTION

According to one aspect of the present invention, a nitride-type III–V group compound semiconductor device includes a substrate and a layered structure including at least a channel layer using two-dimensional electron gas formed over a substrate. The channel layer contains InN.

For example, the channel layer may be a single layer formed of InN, and has a thickness of about 1000 nm or less. Alternatively, the channel layer may have an InN/GaN multi-layered structure. As a further alternative, the channel layer may have an InN/AlN multi-layered structure.

In one embodiment of the invention, the GaN layer or the AlN layer in the multi-layered structure of the channel layer is modulation-doped.

In one embodiment of the invention, each layer included in the InN/GaN or InN/AlN multi-layered structure of the channel layer is a thin layer including a few mono-layers of InN/GaN or InN/AlN in which a mini-band is formed.

In one embodiment of the invention, the substrate is a conductive substrate, and the layered structure includes a buffer layer formed of a nitride-type semiconductor on the conductive substrate, and at least one element selected from the group consisting of Cr, Ti, Fe, Au, V and Nb is added to the buffer layer.

In one embodiment of the invention, the buffer layer includes an AlN layer.

In one embodiment of the invention, the substrate is formed of V-added SiC.

Thus, the invention described herein makes possible the advantage of providing a nitride-type III–V group compound semiconductor which has a large electron mobility in a channel.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
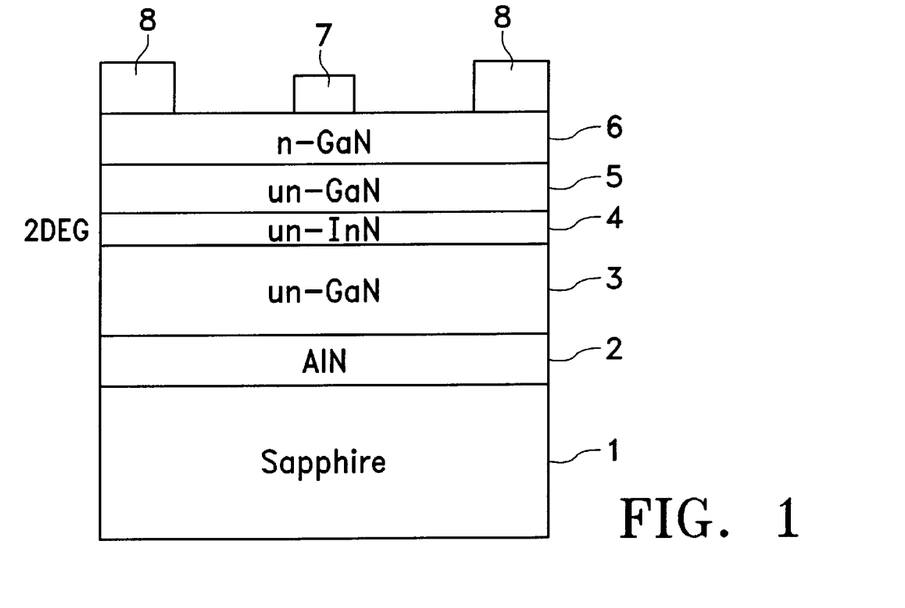
FIG. 1 is a cross-sectional view showing a structure of an HFET according to Example 1 of the present invention.

FIG. 1 is a cross-sectional view schematically showing a structure of a nitride-type HFET according to the first example of the present invention.

Reference numeral 1 denotes a (0001) sapphire substrate, 2 denotes an AlN low-temperature grown buffer layer (thickness: about 20 nm), 3 denotes an undoped GaN buffer layer (carrier concentration: about $5 \times 10^{16}$ cm$^{-3}$ and thickness: about 2 μm), 4 denotes an undoped InN channel layer (carrier concentration: about $4 \times 10^{17}$ cm$^{-3}$ and thickness: about 10 nm), 5 denotes an undoped GaN spacer layer (carrier concentration: about $5 \times 10^{16}$ cm$^{-3}$ and thickness: about 10 nm); and 6 denotes an n-type GaN donor layer (carrier concentration: about $2 \times 10^{18}$ cm$^{-3}$ and thickness: about 3 μm). As a crystal growth method for forming such a layered structure, MOVPE (Metallorganic vapor phase epitaxy), MBE (Molecular beam epitaxy), or the like can be employed. Reference numerals 7 and 8 in FIG. 1 denote a gate electrode and source/drain electrodes, respectively.

In the present example of the present invention, MOVPE is typically used as the crystal growth method. An MOVPE process is as follows. First, the (0001) sapphire substrate 1 is cleaned for about 10 minutes at a substrate temperature of about 1100° C. in a hydrogen atmosphere. Next, the substrate temperature is set at about 550° C. to grow the AlN low-temperature grown buffer layer 2 on the substrate 1. Then, the substrate temperature is set at about 1000° C. to grow the undoped GaN buffer layer 3. Further, the undoped InN channel layer 4 is grown at the substrate temperature of about 800° C, and the undoped GaN spacer layer 5 and the n-type GaN donor layer 6 are grown while elevating the substrate temperature to about 1000° C.

The respective electrodes 7 and 8 can be provided by a known process in the art.

Hole effect measurement for the above structure shows that the electron mobility is about 2000 cm$^2$/Vs at room temperature and about 8000 cm$^2$/Vs at about 77 K.

Furthermore, an HFET having a gate length of about 1 μm and a distance between a source and a drain of about 5 μm is produced and evaluated for its characteristics. As a result, the maximum oscillation frequency fmax is about 20 GHz, and the trans-conductance gm is about 180 mS/mm at room temperature and about 120 mS/mm at about 250° C. On the other hand, in the case where a conventional GaN channel layer is used in the same structure, the maximum oscillation frequency fmax is about 15 GHz, and the trans-conductance gm is about 150 mS/mm at room temperature and about 80 mS/mm at about 200° C.

Thus, the effect of the InN channel layer 4 of the present invention is verified. The maximum operating temperature is about 280° C.

The carrier concentration and the electron mobility of the undoped InN material itself are about $4 \times 10^{17}$ cm$^{-3}$ and about 1200 cm$^2$/Vs, respectively. This electron mobility is about three times that of GaN. This large mobility results in significant improvement of the HFET characteristics.

For the further study of the InN channel layer 4 to be provided in the present invention, $In_xGa_{1-x}N$ ($0 \leq x \leq 1$) is used for constituting a channel layer in the nitride-type semiconductor device in order to study how the electron mobility therein changes at about 77 K in accordance with changes in the indium (In) mole fraction (x). It should be noted that in the case where an InGaAs channel layer is formed on a GaAs layer, the maximum In mole fraction is normally restrained as much as 20% in view of lattice mismatching. However, in the following explanation, such lattice mismatching is intentionally ignored, and the In mole fraction is changed up to x=1.

Figure 2:
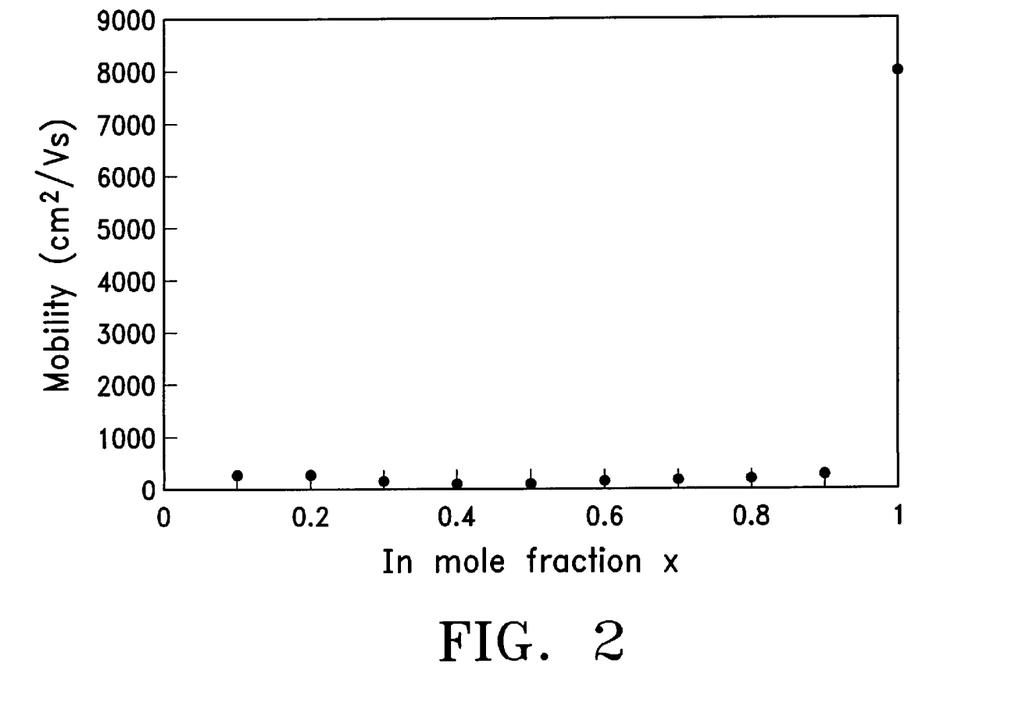
FIG. 2 is a graph showing the dependency of two-dimensional electron gas mobility on an In mole fraction.

FIG. 2 is a resultant graph showing changes in the electron mobility of two-dimensional electron gas according to the In mole fraction x.

As shown in the graph, an increase in the electron mobility cannot be found in any mole fraction except for x=1. This is caused by the fact that a film having a uniform composition distribution cannot be obtained in $In_xGa_{1-x}N$ (0<x<1). As a result, alloy scattering becomes larger, so that an increase in the electron mobility as found in the case of InGaAs cannot be seen.

On the other hand, although it is disadvantageous when the lattice mismatching is considered, InN obtained at x=1 shows a peculiar increase in the electron mobility.

Thus, by the present invention, it has been found that InN is outstanding as a channel material.

Next, the acceptable range of a thickness of an InN channel layer 4 is studied in respect of the electron mobility of two-dimensional gas.

At a hetero-interface, an area where the two-dimensional gas is formed is as much as several tens of nm. Thus, the upper limit of the thickness of the InN channel layer 4 depends upon how much the electron scattering therein, caused by the decrease in crystallinity which is in turn caused by strain, affects the movement of the two-dimensional gas.

Figure 3:
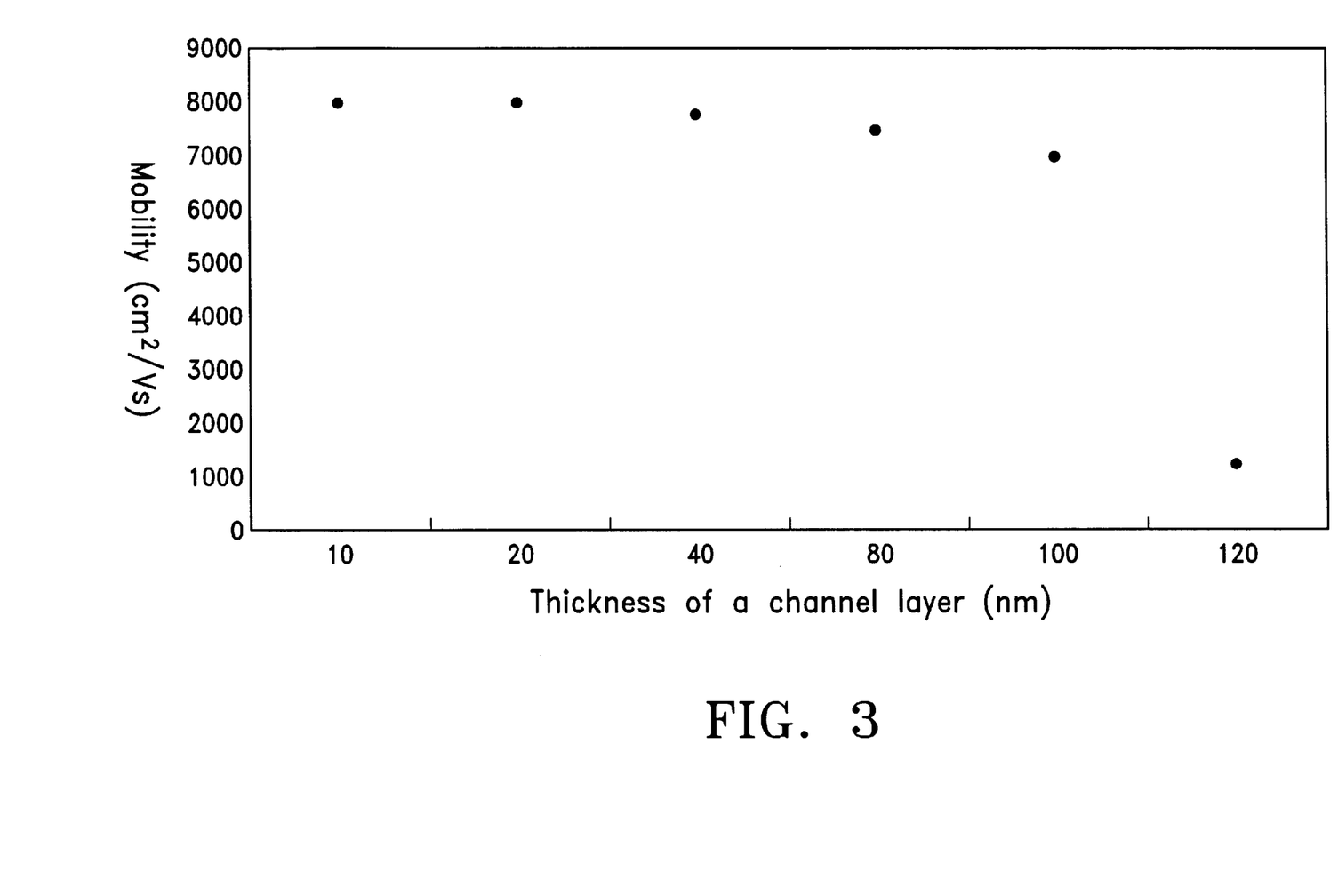
FIG. 3 is a graph showing the dependency of two-dimensional electron gas mobility on a channel layer thickness.

FIG. 3 shows a correlation between the thickness of a channel layer and the electron mobility therein.

It is understood from the results in FIG. 3 that the electron mobility decreases rapidly and is affected significantly by disordered crystallinity when the thickness of the channel layer becomes greater than about 100 nm.

EXAMPLE 2

Figure 4:
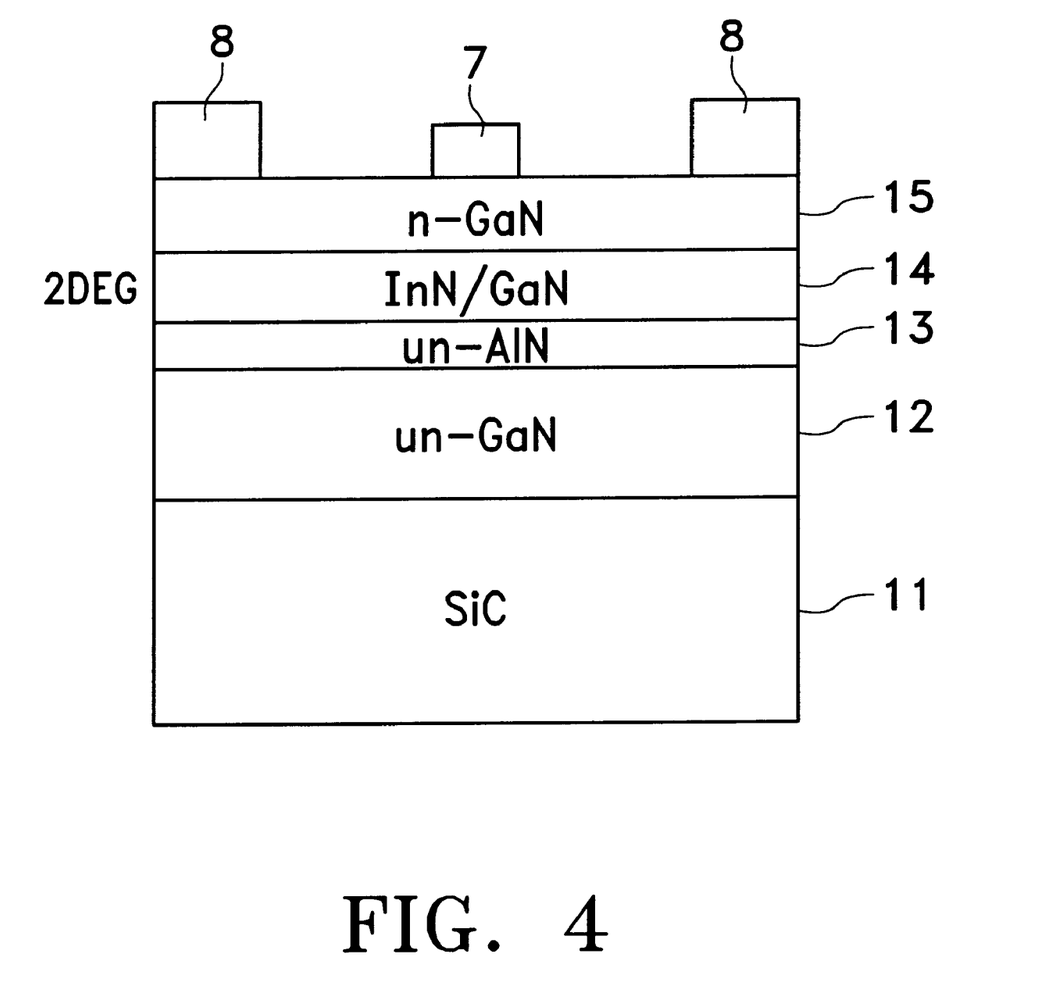
FIG. 4 is a cross-sectional view showing a structure of an HFET according to Example 2 of the present invention.

FIG. 4 is a cross-sectional view schematically showing a nitride-type HFET according to the second example of the present invention.

Reference numeral 11 denotes a (0001) 6H-SiC substrate, 12 denotes an undoped GaN buffer layer (carrier concentration: about $5 \times 10^{16}$ cm$^{-3}$ and thickness: about 2 μm), 13 denotes an undoped AlN barrier layer (thickness: about 20 nm), 14 denotes an undoped InN/GaN channel layer (thickness: about 1 nm/1 nm×10 cycle), 15 denotes an n-type GaN cap layer (carrier concentration of about $5\times10^{16}$ cm$^{-3}$ and thickness: about 10 nm), 7 denotes a Pt/Au gate electrode, and 8 denotes Ti/Al source/drain electrodes. As a crystal growth method for forming such a layered structure, MOVPE, MBE, or the like can be employed. A process of forming such a structure in this example is substantially the same as that of Example 1, and thus, the explanation thereof is omitted herein.

Hole effect measurement for the above structure shows that the electron mobility is about 2100 cm$^2$/Vs at room temperature and about 8500 cm$^2$/Vs at about 77 K.

Furthermore, an HFET having a gate length of about 1 $\mu$m and a distance between a source and a drain of about 5 $\mu$m is produced and evaluated for its characteristics. As a result, the maximum oscillation frequency fmax is about 18 GHz, and the trans-conductance gm is about 150 mS/mm at room temperature and about 120 mS/mm at about 250° C.

In the case where an InN/GaN multi-layered channel layer 14 is used instead of an InN single layer 4 in Example 1, a band-gap of the channel layer 14 is increased, and the temperature characteristics of the nitride-type HFET is improved. Specifically, in the case where the InN/GaN multi-layered channel layer 14 is employed, the maximum operating temperature is increased by about 50° C., as compared with the case where the single InN channel layer 4 is used.

The multi-layered structure used as the channel layer 14 is required to have a thickness such that a mini-band is formed within the multi-layered structure so as to allow electrons to be supplied from the source electrode to all of the InN layer in the multi-layered channel layer 14. This is based on the fact that when no mini-band is formed in the multi-layered structure, each InN layer is isolated, and thus, none of the InN layer would work as a channel. Therefore, thickness of each layer in the multi-layered channel layer 14 is required to be thin enough to form a mini-band therein.

Figure 5A:
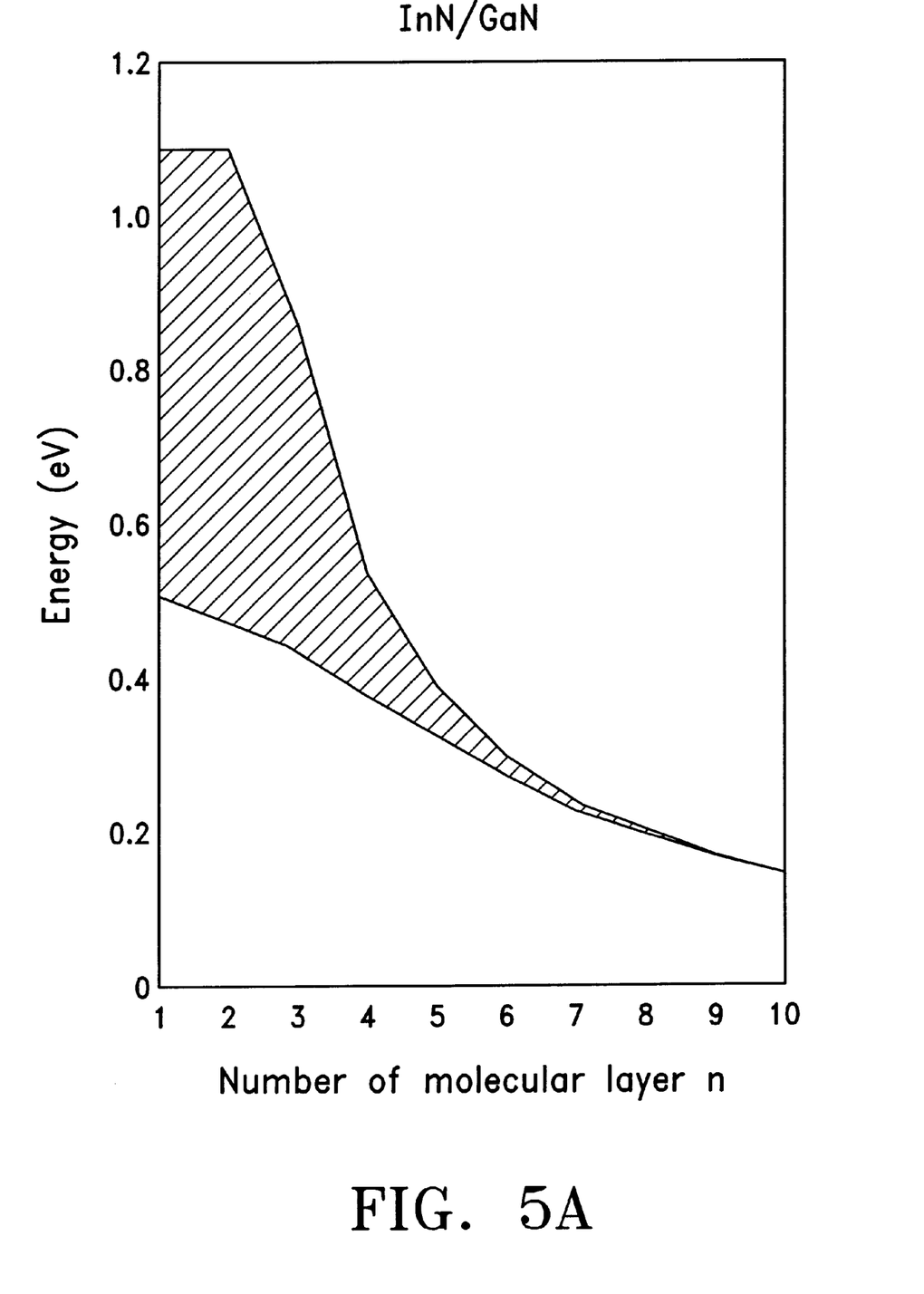
FIG. 5A is a graph showing the calculation results of a first mini-band in the case where a channel layer has an InN/GaN multi-layered structure.
Figure 5B:
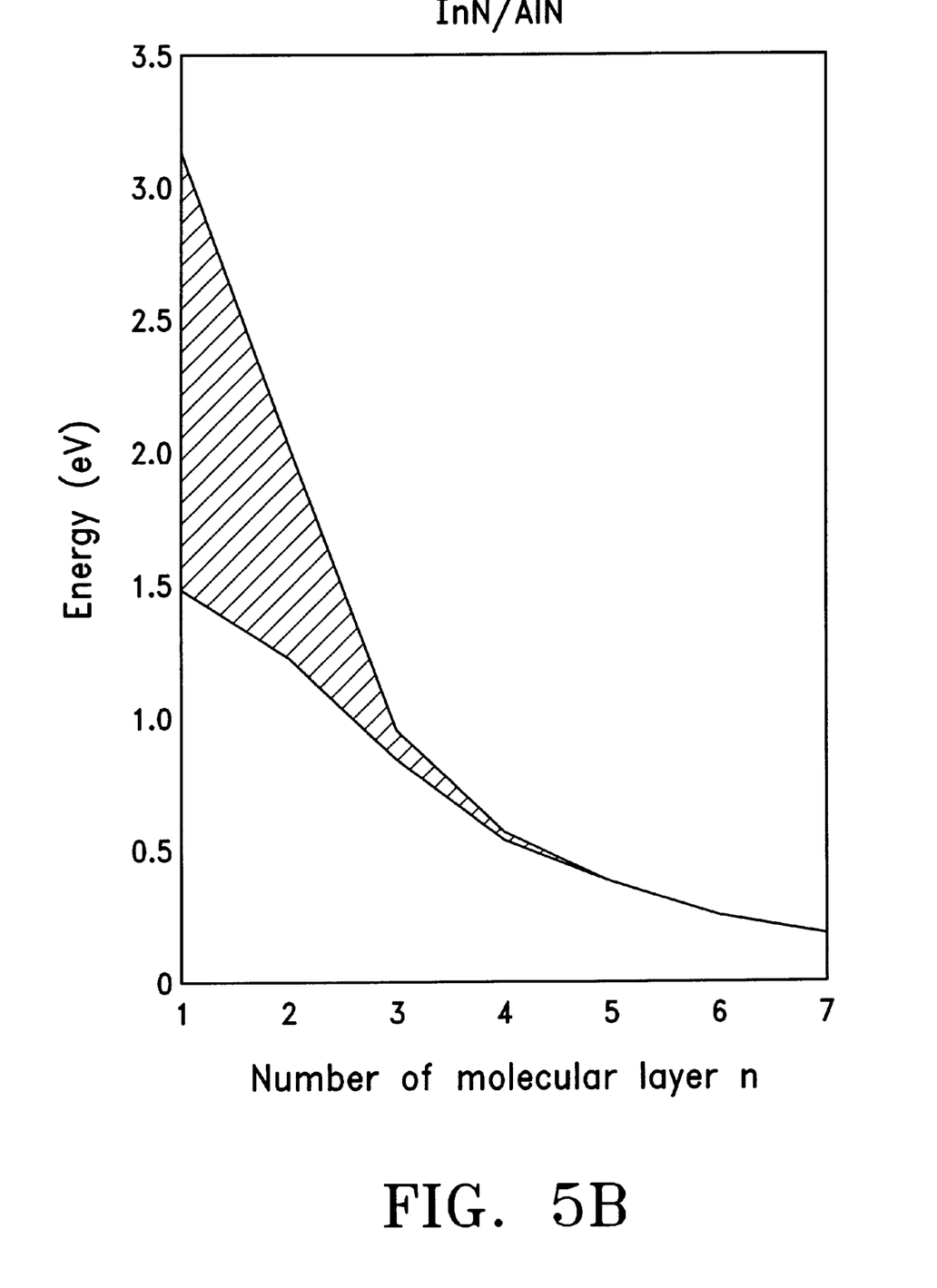
FIG. 5B is a graph showing the calculation results of a first mini-band in the case where a channel layer has an InN/AlN multi-layered structure.

FIG. 5A shows a mini-band in a conduction band in which $n_{AlN}=n_{InN}$ (where n is the number of molecular layer), and FIG. 5B shows a mini-band in a conduction band in which $n_{GaN}=n_{InN}$ (where n is the number of molecular layer).

As apparent from FIGS. 5A and 5B, in order to form mini-bands in the multi-layered channel layer, the number of molecular layers is required to be 9 or less for the InN/GaN multi-layered structure and 5 or less for the InN/AlN multi-layered structure. However, a thinner barrier layer (GaN and AlN) allows a mini-band to form in the thicker well layer. For example, when a GaN barrier layer has a thickness of one-molecular layer, a mini-band can be formed even in an InN well layer having a thickness of a 20-molecular layer.

EXAMPLE 3

Figure 6:
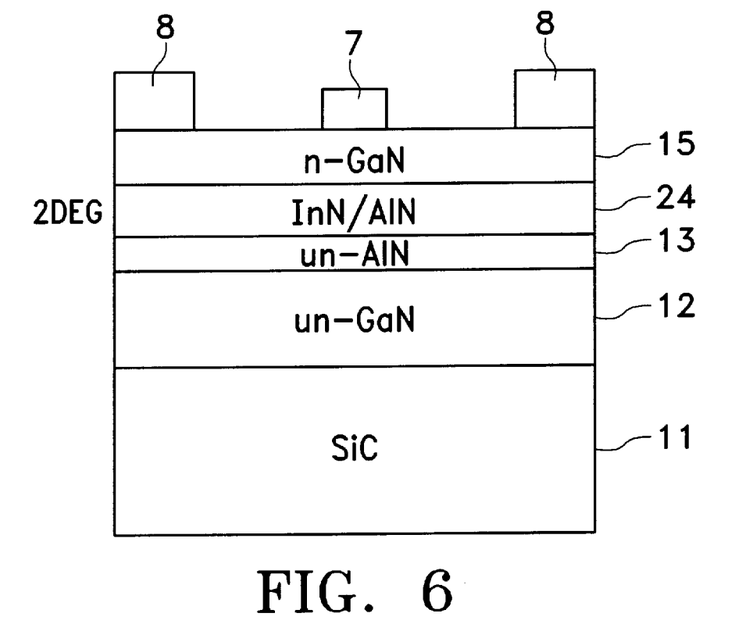
FIG. 6 is a cross-sectional view showing a structure of an HFET according to Example 3 of the present invention.

FIG. 6 is a cross-sectional view schematically showing a nitride-type HFET according to the third example of the present invention.

Reference numeral 11 denotes a (0001) 6H-SiC substrate, 12 denotes an undoped GaN buffer layer (carrier concentration: about $5\times10^{16}$ cm$^{-3}$ and thickness: about 2 $\mu$m), 13 denotes an undoped AlN barrier layer (thickness: about 20 nm), 24 denotes an undoped InN/AlN channel layer (thickness: about 1 nm/1 nm×10 cycle), 15 denotes an n-type GaN cap layer (carrier concentration: about $5\times10^{16}$ cm$^{-3}$ and thickness: about 10 nm), 7 denotes a Pt/Au gate electrode, and 8 denotes Ti/Al source/drain electrodes. As a crystal growth method for forming such a layered structure, MOVPE, MBE, or the like can be employed as in the first example. Moreover, the respective electrodes 7 and 8 can be provided by a known process in the art.

Hole effect measurement for the above structure shows that the electron mobility is about 2500 cm$^2$/Vs at room temperature and about 9000 cm$^2$/Vs at about 77 K.

Furthermore, an HFET having a gate length of about 1 $\mu$m and a distance between a source and a drain of about 5 $\mu$m is produced and evaluated for its characteristics. As a result, the maximum oscillation frequency fmax is about 22 GHz, and the trans-conductance gm is about 200 mS/mm at room temperature and about 170 mS/mm at 250° C.

When an InN/AlN multi-layered channel layer 24 is used instead of an InN single layer 4 of Example 1, the band-gap of the channel layer 24 is increased as in the case of the InN/GaN channel layer 14 of Example 2, and temperature characteristics of the nitride-type HFET is improved. Specifically, in the case of the InN/AlN channel layer 24 of the present example, the maximum operating temperature is increased by about 70° C. compared with a single InN channel layer 4.

Moreover, in the case of the InN/AlN multi-layered channel layer 24, strains of InN and AlN thereof cancel each other, so that the stress within the InN/AlN multi-layered channel layer 24 can be decreased compared with the InN/GaN multi-layered channel layer 14 of Example 2. Accordingly, the film quality of the channel layer is improved in the present example to result in the further enhanced characteristics of the nitride-type HFET.

As in the case of the InN/GaN channel layer 14 of Example 2, it is desirable to set the thickness of each layer of the InN/AlN multi-layered channel layer 24 in such a manner that a mini-band can be formed therein.

EXAMPLE 4

In this example, the GaN layer in the InN/GaN channel layer 14 of Example 2 and the AlN layer in the InN/AlN channel layer 24 of Example 3 are respectively subjected to the modulation doping of Si, and the resultant nitride-type HFETs are evaluated for their charac- teristics. Si concentration is prescribed so as to obtain a carrier concentration of $1\times10^{18}$ cm$^{-3}$ in the GaN single layer as well as in the AlN single layer.

Specifically, the HFETs having a gate length of about 1 $\mu$m and a distance between a source and a drain of about 5 $\mu$m are produced and evaluated for their characteristics. As a result, the maximum oscillation frequencies fmax are about 25 GHz and about 28 GHz, and the trans-conductances gm are about 160 mS/mm and about 210 mS/mm, respectively, at room temperature.

EXAMPLE 5

Figure 7:
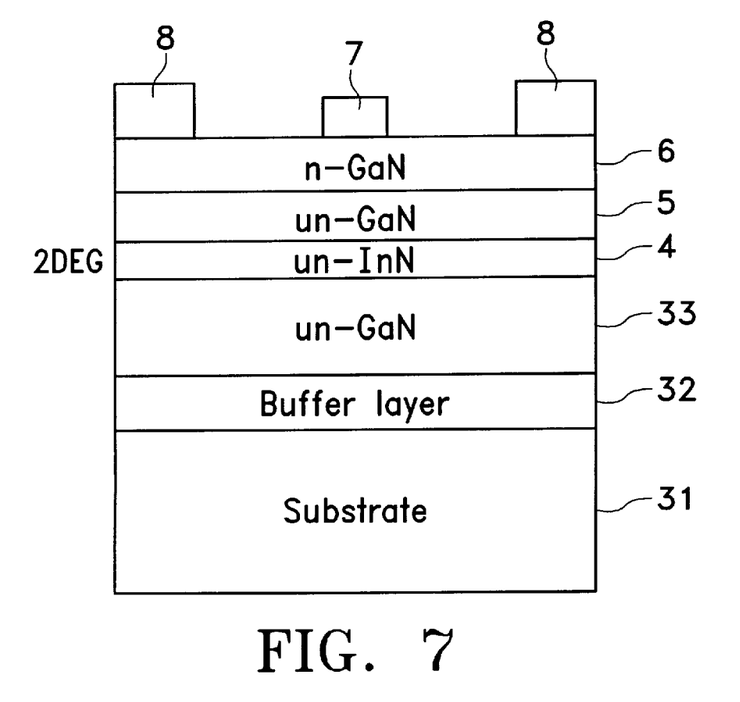
FIG. 7 is a cross-sectional view showing a structure of an HFET according to Examples 5, 6, and 7 of the present invention.

FIG. 7 shows a structure of a nitride-type HFET used in Examples 5, 6, and 7.

In Example 5, characteristics of two-dimensional gas in the case where a conductive SiC substrate 31 is used are studied. The other parameters of each layer in the device structure are the same as those in Example 1.

As a crystal growth method for forming such a layered structure, MOVPE, MBE, or the like can be employed. The MBE is employed in the following examples. An MBE process is as follows. First, a substrate 31 is cleaned for about 10 minutes at a substrate temperature of about 800° C. in a vacuum. Then, the substrate temperature is set at about 550° C., and nitride radical is radiated onto the substrate 31 so that the surface of the substrate 31 is nitrided in order to obtain satisfactory growth crystal. Then, a GaN (or AlN) buffer layer 32 is formed on the nitrided surface of the substrate 31. Next, the substrate temperature is set at about 750° C. to grow a GaN layer 33. An undoped InN channel layer 4 is then grown at a substrate temperature of about 650° C., and undoped GaN spacer layer 5 and an n-type GaN donor layer 6 are grown sequentially thereon while elevating the substrate temperature to about 750° C. Finally, a gate electrode 7 and source/drain electrodes 8 are provided on the n-type GaN layer 6 by a known process in the art.

Table 1 shows a comparison between the electron mobility of an HFET structure formed on a Cr-doped GaN buffer layer which is provided on a conductive SiC substrate and the electron mobility of an HFET structure formed on an undoped GaN buffer layer which is provided on a conductive SiC substrate.

TABLE 1

|  | Room temperature | 77K |
| --- | --- | --- |
| Cr-doped GaN buffer layer | 1900 cm$^2$/Vs | 9000 cm$^2$/Vs |
| Undoped GaN buffer layer | 1700 cm$^2$/Vs | 1900 cm$^2$/Vs |

In the case of the HFET structure using the undoped GaN buffer layer provided on the conductive SiC substrate, the electron mobility does not increase at a low operational temperature because carriers are scattered into the buffer layer or the substrate. In view of this, when GaN is used as a buffer layer, at least a part of the GaN buffer layer needs to be semi-insulating.

In the present invention, by adding Cr, Ti, Fe, Au, V or Nb to the GaN buffer layer 32 as a dopant, a deep level is formed therein, and thus, the semi-insulating nitride semiconductor material for the buffer layer 32 can be obtained. As a result, it becomes possible to prevent carriers from flowing into the substrate 31, so that the mobility increases.

EXAMPLE 6

In Example 6, characteristics of two-dimensional gas in the case where a constituting material of the buffer layer 32 is changed in the structure of FIG. 7 are studied. The other parameters of each layer are the same as those in Example 1.

Table 2 shows a comparison between the electron mobility of an HFET structure formed on an undoped AlN buffer layer which is provided on a conductive SiC substrate and the electron mobility of an HFET structure formed on an undoped GaN buffer layer which is provided on a conductive SiC substrate.

TABLE 2

|  | Room temperature | 77K |
| --- | --- | --- |
| AlN buffer layer | 2000 cm$^2$/Vs | 10000 cm$^2$/Vs |
| GaN buffer layer | 1800 cm$^2$/Vs | 2100 cm$^2$/Vs |

In the case of the HFET structure formed on the undoped GaN buffer layer provided on the conductive SiC substrate, as in the case of Example 5, the electron mobility does not increase because carriers are flowed into the substrate. In contrast, in the case of the HFET structure formed on the undoped AlN buffer layer, a flow of carriers into the substrate does not occur, so that the electron mobility is increased. This effect is due to high insulation of AlN and is different from the conventional effect (i.e., effect of nucleus formation) of a low-temperature grown buffer layer formed on a sapphire substrate.

In Examples 5 and 6, a substrate 31 having small lattice mismatching with a nitride-type semiconductor material for the buffer layer 32 is used. In the case of a substrate having 10% or more lattice mismatching (e.g., sapphire), a low-temperature grown nuclear formation layer is preferably used between the substrate 31 and the buffer layer 32.

EXAMPLE 7

In Example 7, characteristics of two-dimensional gas in the case where a semi-insulating SiC substrate is used in the structure of FIG. 7 are studied.

Table 3 shows comparison between the electron mobility of an HFET structure formed on a conductive SiC substrate and the electron mobility of an HFET structure formed on a V-added SiC substrate (semi-insulating substrate).

TABLE 3

|  | Room temperature | 77K |
| --- | --- | --- |
| Conductive Sic substrate | 1800 cm$^2$/Vs | 1800 cm$^2$/Vs |
| Semi-insulating SiC substrate | 2100 cm$^2$/Vs | 12000 cm$^2$/Vs |

In the case of the HFET structure formed on the undoped GaN buffer layer on the conductive SiC substrate, the electron mobility does not increase because carriers are scattered into the substrate. In contrast, in the case of the HFET structure formed on the undoped GaN buffer layer on the V-added (semi-insulating) SiC substrate, a flow of carriers into the substrate does not occur, so that the electron mobility increases.

As described above, according to the present invention, by using InN as a constituting material of a channel layer, the electron mobility of the channel layer is increased, and the operational characteristics of a resultant nitride-type HFET are remarkably improved.

By using an InN/GaN or InN/AlN multi-layered structure as a channel layer, the temperature characteristics of an HFET are further improved. In particular, in the case of the InN/AlN structure, strains of InN and AlN therein cancel each other, so that the stress within the layered structure can be decreased, which improves film quality of the channel layer.

By using a semi-insulating nitride semiconductor material with a dopant added thereto as a buffer layer, a flow of carriers into a substrate is prevented, so that the electron mobility can be increased.

By using a semi-insulating substrate, e.g., made of V-added SiC, carriers do not flow into the substrate, so that the electron mobility can be increased even more.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride-type III–V group compound semiconductor device, comprising
a substrate; and
a layered structure including at least a channel layer using two-dimensional electron gas formed over a substrate, wherein the channel layer has a multi-layered structure containing InN.

2. A semiconductor device according to claim 1, wherein the channel layer has an InN/AlN multi-layered structure.

3. A semiconductor device according to claim 2, wherein the AlN layer in the multi-layered structure is modulation-doped.

4. A semiconductor device according to claim 2, wherein each layer included in the InN/AlN multi-layered structure is a thin layer including a few mono-layers of InN/AlN in which a mini-band is formed.

5. A nitride-type III–V group compound semiconductor device comprising:
a substrate; and
a layered structure including at least a channel layer using two-dimensional electron gas formed over a substrate, wherein the channel layer has an InN/GaN multi-layered structure.

6. A semiconductor device according to claim 5, wherein each layer included in the InN/GaN multi-layered structure is a thin layer including a few mono-layers of InN/GaN in which a mini-band is formed.

7. A nitride-type III–V group compound semiconductor device comprising:
a substrate; and
a layered structure including at least a channel layer using two-dimensional electron gas formed over a substrate, wherein the channel layer has an InN/GaN multilayered structure and the GaN layer in the multi-layered structure is modulation-doped.

8. A nitride-type III–V group compound semiconductor device comprising:
a substrate; and
a layered structure including at least a channel layer using two-dimensional electron gas formed over a substrate, wherein the channel layer has a multi-layered structure containing InN and the substrate is a conductive substrate, and the layered structure includes a buffer layer formed of a nitride-type semiconductor on the conductive substrate, and at least one element selected from the group consisting of Cr, Ti, Fe, Au, V and Nb is added to the buffer layer.

9. A semiconductor device according to claim 8, wherein the buffer layer includes an AlN layer.

10. A nitride-type III–V group compound semiconductor device comprising:
a substrate; and
a layered structure including at least a channel layer using two-dimensional electron gas formed over a substrate, wherein the channel layer has a multi-layered structure containing InN and the substrate is formed of V-added SiC.

* * * * *

UNITED STATES PATENT AND TRADEMARK OFFICE
CERTIFICATE OF CORRECTION

PATENT NO. : 6,177,685 B1
DATED : January 23, 2001
INVENTOR(S) : Nobuaki Teraguchi and Akira Suzuki It is certified that error appears in the above-identified patent and that said Letters Patent is hereby corrected as shown below:

<u>Under "Foreign Application Priority Data"</u>
Please correct the foreign application number from 10-008210 to -- 10-008201 --.

Signed and Sealed this

Fourteenth Day of August, 2001

*Attest:*

NICHOLAS P. GODICI
*Attesting Officer*     *Acting Director of the United States Patent and Trademark Office*